US012772832B2

(12) United States Patent
Song et al.

(10) Patent No.: US 12,772,832 B2
(45) Date of Patent: Oct. 20, 2026

(54) SEMICONDUCTOR DEVICE

(71) Applicant: SAMSUNG ELECTRONICS CO., LTD., Suwon-si (KR)

(72) Inventors: Minjun Song, Suwon-si (KR); Jongmin Lee, Suwon-si (KR); Joongwon Shin, Suwon-si (KR); Nara Lee, Suwon-si (KR); Jimin Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 490 days.

(21) Appl. No.: 18/209,820

(22) Filed: Jun. 14, 2023

(65) Prior Publication Data

US 2024/0071923 A1 Feb. 29, 2024

(30) Foreign Application Priority Data

Aug. 31, 2022 (KR) ........................ 10-2022-0109786

(51) Int. Cl.
*H10W 20/41* (2026.01)
*H10B 12/00* (2023.01)
(Continued)

(52) U.S. Cl.
CPC .......... *H10W 20/435* (2026.01); *H10B 80/00* (2023.02); *H10W 20/42* (2026.01);
(Continued)

(58) Field of Classification Search
CPC ............. H01L 25/0657; H01L 25/0652; H01L 25/043; H01L 25/071; H01L 25/074;
(Continued)

(56) References Cited

U.S. PATENT DOCUMENTS 6,958,540 B2 10/2005 Gambino et al.
10,546,812 B1 1/2020 Yang
(Continued)

FOREIGN PATENT DOCUMENTS

CN 110783259 A 2/2020
CN 113451202 A 9/2021
(Continued)

OTHER PUBLICATIONS

Extended European Search Report dated Jan. 26, 2024 from the European Patent Office for corresponding European Patent Application No. 23184930.8.

*Primary Examiner* — Wael M Fahmy
*Assistant Examiner* — Quinton A Brasfield
(74) *Attorney, Agent, or Firm* — Muir Patent Law, PLLC

(57) ABSTRACT

A semiconductor device may include lower metal wirings on a substrate, a first upper insulating interlayer on the lower metal wirings, a first upper wiring including a first upper via in the first upper insulating interlayer and a first upper metal pattern on the first upper insulating interlayer. The semiconductor device may also include a second upper insulating interlayer on the first upper insulating interlayer, an uppermost wiring including an uppermost via in the second upper insulating interlayer, an uppermost metal pattern on the second upper insulating interlayer, and an oxide layer for supplying hydrogen on the second upper insulating interlayer. The lower metal wirings may be stacked in a plurality of layers. The oxide layer for supplying hydrogen may cover the uppermost wiring. A thickness of the uppermost via may be less than 40% of a thickness of the uppermost metal pattern.

20 Claims, 12 Drawing Sheets

(51) Int. Cl.

*H10B 80/00* (2026.01)
*H10W 20/42* (2026.01)
*H10W 20/43* (2026.01)
*H10W 20/44* (2026.01)
*H10W 20/47* (2026.01)
*H10W 90/00* (2026.01)
*H10W 90/20* (2026.01)

(52) U.S. Cl.

CPC ......... *H10W 20/425* (2026.01); *H10W 20/43* (2026.01); *H10W 20/47* (2026.01); *H10W 90/00* (2026.01); *H10B 12/30* (2023.02); *H10W 20/4421* (2026.01); *H10W 90/297* (2026.01); *H10W 90/722* (2026.01); *H10W 90/724* (2026.01)

(58) Field of Classification Search

CPC .. H01L 25/0756; H01L 25/112; H01L 25/117; H01L 2224/08145; H01L 27/0688; H01L 23/3185; H01L 23/3157; H01L 21/56; H01L 21/563; H01L 23/5389; H01L 23/528; H01L 23/5283; H10B 12/30; H10W 90/297; H10W 20/20–233; H10W 20/01; H10W 20/021–0265; H10W 70/63–635

See application file for complete search history.

(56) References Cited

U.S. PATENT DOCUMENTS

| | | | | |
|---|---|---|---|---|
| 10,566,284 | B2 * | 2/2020 | Kim | H10W 20/096 |
| 10,692,869 | B2 | 6/2020 | Takemura et al. | |
| 11,011,469 | B2 | 5/2021 | Kim et al. | |
| 11,049,827 | B2 | 6/2021 | Choi et al. | |
| 11,113,443 | B1 | 9/2021 | Chang et al. | |
| 11,133,253 | B2 | 9/2021 | Lee et al. | |
| 11,342,235 | B2 | 5/2022 | Choi et al. | |
| 11,495,533 | B2 | 11/2022 | Chang et al. | |
| 2020/0035613 | A1 | 1/2020 | Kim et al. | |
| 2021/0104462 | A1 * | 4/2021 | Lee | H10W 20/40 |
| 2021/0125955 | A1 * | 4/2021 | Suh | H10W 90/00 |
| 2021/0375759 | A1 | 12/2021 | Lee et al. | |
| 2021/0375896 | A1 * | 12/2021 | Kim | H10B 41/46 |
| 2022/0208687 | A1 | 6/2022 | Hwang et al. | |
| 2023/0187212 | A1 * | 6/2023 | Hwang | H10P 95/94 438/623 |

FOREIGN PATENT DOCUMENTS

| | | | |
|---|---|---|---|
| KR | 10-2021-0039744 | A | 4/2021 |
| TW | 202220189 | A | 5/2022 |

* cited by examiner

SEMICONDUCTOR DEVICE

CROSS-REFERENCE TO RELATED APPLICATION

Korean Patent Application No. 10-2022-0109786, filed on Aug. 31, 2022, in the Korean Intellectual Property Office, is incorporated by reference herein in its entirety.

BACKGROUND

1. Field

Example embodiments relate to a semiconductor device. Particularly, example embodiments relate to a semiconductor device including an upper wiring structure.

2. Description of the Related Art

In general, a semiconductor device may include circuit patterns and an upper wiring structure including stacked wirings electrically connecting the circuit patterns. As the semiconductor device is highly integrated, a height of the upper wiring structure may increase, and a vertical thermal resistance may increase due to the upper wiring structure.

SUMMARY

Embodiments are directed to a semiconductor device. The semiconductor device may include lower metal wirings on a substrate, a first upper insulating interlayer on the lower metal wirings, a first upper wiring including a first upper via in the first upper insulating interlayer and a first upper metal pattern on the first upper insulating interlayer. The semiconductor device may also include a second upper insulating interlayer on the first upper insulating interlayer, an uppermost wiring including an uppermost via in the second upper insulating interlayer, an uppermost metal pattern on the second upper insulating interlayer, and an oxide layer for supplying hydrogen on the second upper insulating interlayer. The lower metal wirings may be stacked in a plurality of layers. The second upper insulating interlayer may cover the first upper metal pattern. The oxide layer for supplying hydrogen may cover the uppermost wiring. A thickness of the uppermost via may be less than 40% of a thickness of the uppermost metal pattern.

Embodiments are also directed to a semiconductor device. The semiconductor device may include memory cells on a substrate, lower metal wirings on the memory cells, a first upper insulating interlayer on the lower metal wirings, a first upper wiring including a first upper via in the first upper insulating interlayer and a first upper metal pattern on the first upper insulating interlayer. The semiconductor device may also include a second upper insulating interlayer on the first upper insulating interlayer, an uppermost wiring including an uppermost via in the second upper insulating interlayer, an uppermost metal pattern on the second upper insulating interlayer, and an oxide layer for supplying hydrogen on the second upper insulating interlayer. The semiconductor device may also include an uppermost insulating interlayer on the oxide layer for supplying hydrogen, and an upper capping layer on the uppermost insulating interlayer. The lower metal wirings may be stacked in a plurality of layers. The second upper insulating interlayer may cover the first upper metal pattern. The oxide layer for supplying hydrogen may cover the uppermost wiring. The uppermost insulating interlayer may include silicon oxide and may have a flat upper surface. A thickness of the uppermost via may be less than 40% of a thickness of the uppermost metal pattern.

Embodiments are also directed to a high-bandwidth memory device. The high-bandwidth memory device may include a package substrate, a plurality of memory dies stacked on a package substrate, a logic die on the plurality of memory dies, and a molding member on the package substrate. The molding member may cover the memory dies and a logic die. Each of the plurality of memory dies may include lower metal wirings on a substrate, a first upper wiring including a first upper via and a first upper metal pattern on the lower metal wiring, an uppermost wiring including an uppermost via, and an uppermost metal pattern on the first upper wiring. The lower metal wirings may be stacked in a plurality of layers. A thickness of the uppermost via may be less than 40% of a thickness of the uppermost metal pattern.

In example embodiments, in the upper wiring structure of the semiconductor device, a thickness of the uppermost wiring including the uppermost via and the uppermost metal pattern may be decreased. Also, a thickness of the uppermost via may be less than 40% of a thickness of the uppermost metal pattern. As the thickness of the uppermost wiring is decreased, a vertical thermal resistance of the upper wiring structure may be decreased.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
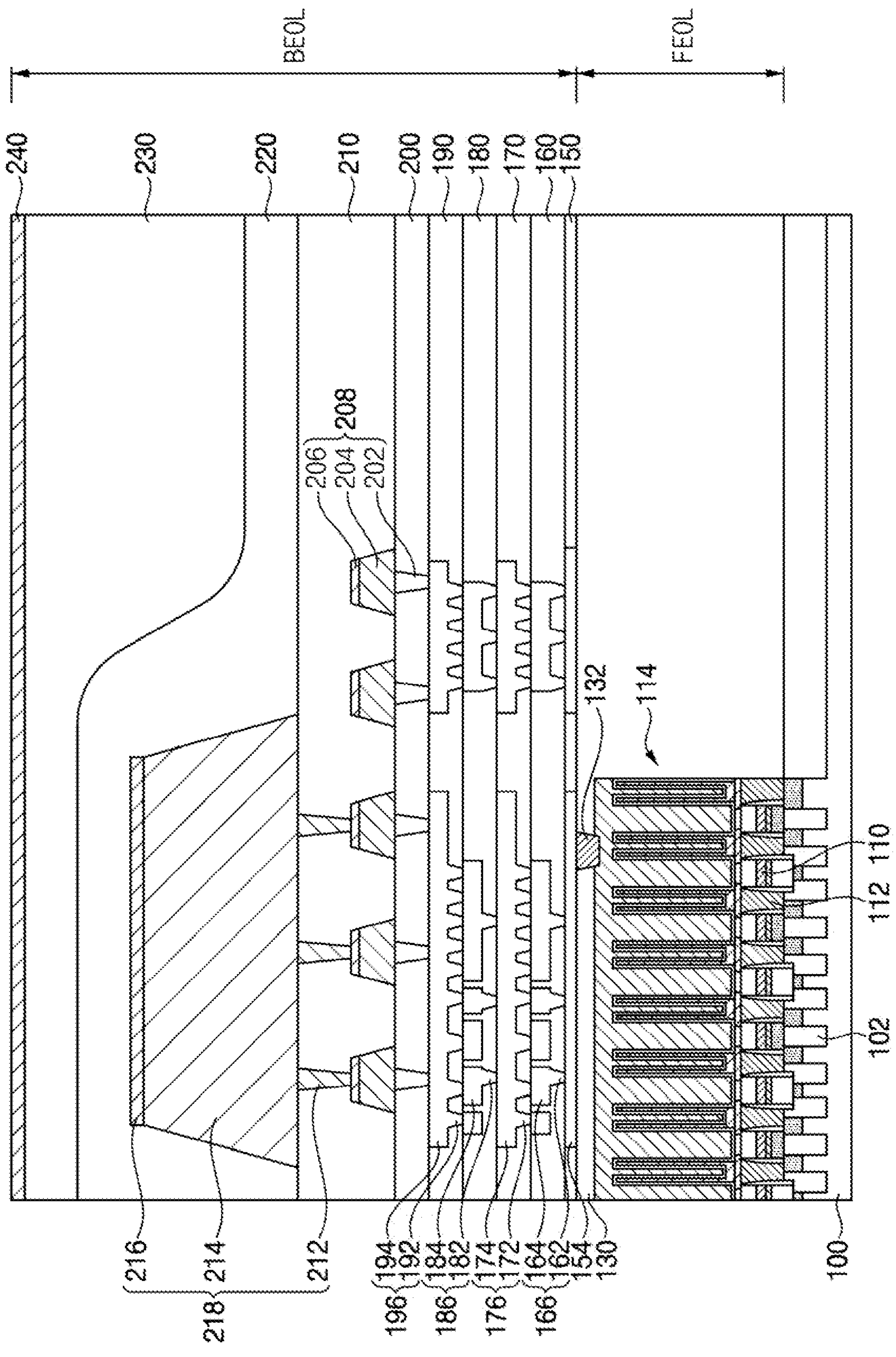
FIG. 1 is a cross-sectional view of a semiconductor device according to example embodiments.
Figure 2:
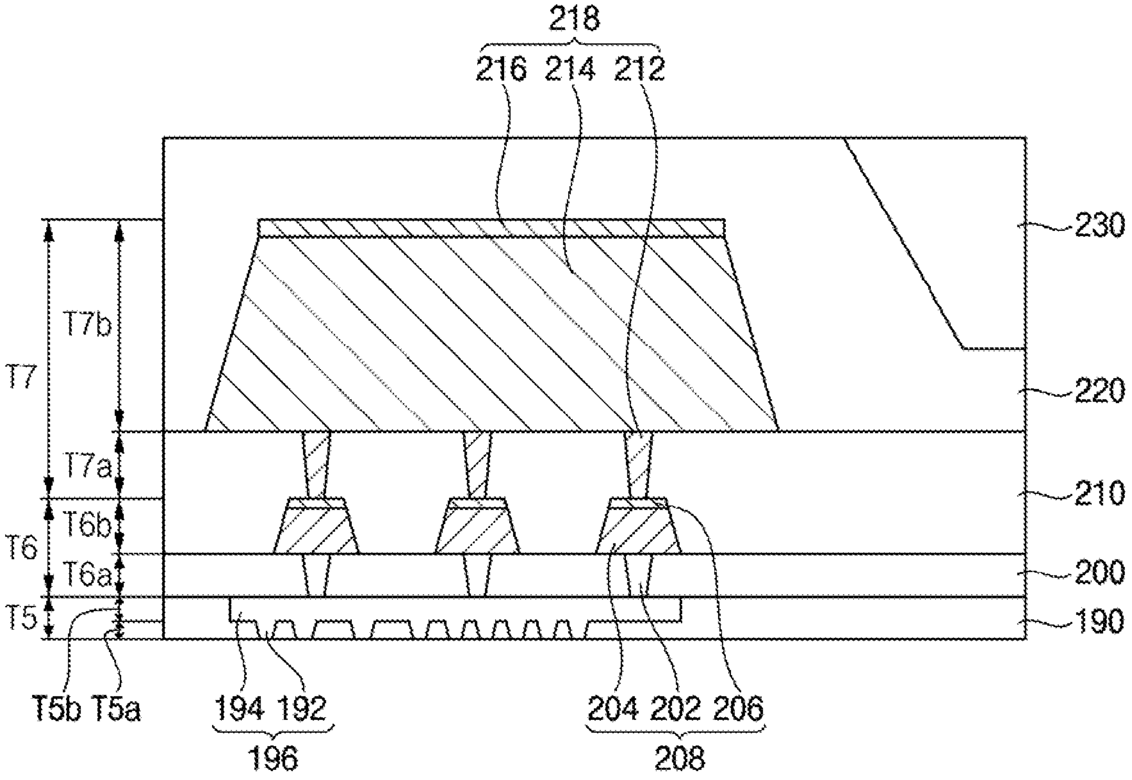
FIG. 2 is a cross-sectional view of a portion including an uppermost wiring in FIG. 1.

FIG. 1 is a cross-sectional view of a semiconductor device according to example embodiments. FIG. 2 is a cross-sectional view of a portion including an uppermost wiring in FIG. 1.

In this example embodiment, it may be described that the semiconductor device is a DRAM device.

Referring to FIGS. 1 and 2, a front end of line (FEOL) structure may be on a substrate 100, and a back end of line (BEOL) structure may be on the FEOL structures. Circuit patterns serving as the FEOL structure may be on the substrate 100. The FEOL structure may include memory cells and core/peripheral circuits. The BEOL structure may include metal wirings (i.e., metal interconnections) for electrically connecting the circuit patterns in the FEOL structure. First, the FEOL structure on the substrate 100 may be described.

An isolation pattern 102 for defining an active region may be on the substrate 100. Cell transistors, bit line structures 110, first lower wirings 112 and capacitors 114 for constituting memory cells may be on the substrate 100. Hereinafter, the cell transistors, bit line structures 110, first lower wirings 112, and capacitors 114 on the substrate 100 are collectively referred to as a memory cell structure.

A lower insulating interlayer 130 may be on the substrate 100 to cover the memory cell structure. A contact plug 132 electrically connected to the capacitor 114 may be further included in the lower insulating interlayer 130.

A BEOL structure on the FEOL structure may be described. Low-k dielectric layers 150, 160, 170, 180, and 190 and upper insulating interlayers 200 and 210 may be sequentially on the lower insulating interlayer 130 and the contact plug 132. Wirings may be inside and on the low-k dielectric layers 150, 160, 170, 180, and 190 and the upper insulating interlayers 200 and 210.

Low-k dielectric layers 150, 160, 170, 180, and 190 may be on the lower insulating interlayer 130, and upper interlayer dielectric layers 200 and 210 may be on an uppermost low-k dielectric layer (i.e., 190).

In an implementation, first to fifth low-k dielectric layers 150, 160, 170, 180 and 190 may be stacked on the lower insulating interlayer 130. First to fifth wirings 154, 166, 176, 186, and 196 may be formed in the first to fifth low-k dielectric layers 150, 160, 170, 180, and 190, respectively. The number of the low-k dielectric layers and wirings may not be limited thereto.

In example embodiments, the low-k dielectric layers 150, 160, 170, 180, and 190 may be insulation layers having a dielectric constant smaller than 4.4. In an implementation, the low-k dielectric layers 150, 160, 170, 180, and 190 may include, e.g., SiCOH.

In example embodiments, the first wiring 154, which is a lowest wiring in the BEOL structure, may include a first metal pattern. Each of the second to fifth wirings 166, 176, 186, and 196 may include a via and a metal pattern. In an implementation, the second wiring 166 may include a second via 162 and a second metal pattern 164, and the third wiring 176 may include a third via 172 and a third metal pattern 174. The fourth wiring 186 may include a fourth via 182 and a fourth metal pattern 184, and the fifth wiring 196 may include a fifth via 192 and a fifth metal pattern 194. In example embodiments, the first to fifth wirings 154, 166, 176, 186, and 196 may include, e.g., copper.

The second to fifth wirings 166, 176, 186, and 196 may have second to fifth thicknesses, respectively. The second to fifth thicknesses may be the same as or different from each other. In example embodiments, each of the second to fifth thicknesses may be in range of about 4000 Å to about 8000 Å.

Meanwhile, the first wiring 154 may include only the first metal pattern, so that a first thickness of the first wiring may be less than each of the second to fifth thicknesses. In example embodiments, the first thickness may be in a range of about 1000 Å to about 3000 Å.

In the n-th wiring (e.g., n is 2 to 5) including the via and the metal pattern, a thickness of the n-th via may be greater than 50% of a thickness of the n-th metal pattern. Also, the thickness of the n-th via may be less than the thickness of the n-th metal pattern. In an implementation, as shown in FIG. 2, the thickness of the fifth via T5*a* may be greater than 50% of the thickness T5*b* of the fifth metal pattern, in the fifth wiring. However, thicknesses of the via and metal pattern may be controlled according to an electrical target of the wiring.

In the n-th wiring, the thickness of the n-th via divided by a thickness of the n-th metal pattern multiplied by 100 may be defined as an n-th via thickness ratio, and the n-th via thickness ratio may be in range of about 50% to about 100%. In an implementation, the n-th via thickness ratio may be about 75% to about 95%.

First and second upper insulating interlayers 200 and 210 may be on the fifth low-k dielectric layer 190, which is an uppermost low-k dielectric layer. A sixth wiring 208 and an uppermost wiring 218 may be formed inside and on the first and second upper insulating interlayers 200 and 210. The sixth wiring 208 may be positioned right below the uppermost wiring 218. The first and second upper insulating interlayers 200 and 210 may have a dielectric constant higher than the dielectric constant of each of the low-k dielectric layers 150, 160, 170, 180 and 190.

The first upper insulating interlayer 200 may include a silicon oxide-based material. The first upper insulating interlayer 200 may include, e.g., tetraethyl orthosilicate (TEOS), boro-phosphosicateglass (BPSG), tonen organic silazne (TOSZ), undoped silicate glass (USG), or spin-on glass (SOG).

In example embodiments, the first upper insulating interlayer 200 may not be used as an oxide layer for supplying hydrogen. In an implementation, the first upper insulating interlayer 200 may not include a high density plasma (HDP) oxide layer.

A sixth via 202 may be formed in the first upper insulating interlayer 200. A sixth metal pattern 204 may be on the first upper insulating interlayer 200, and may contact the sixth via 202. The sixth wiring may include the sixth via and a sixth metal pattern.

In example embodiments, the sixth via 202 may include, e.g., tungsten. In example embodiments, the sixth metal pattern 204 may include, e.g., tungsten. In an implementation, a first barrier metal pattern 206 may be further included on the sixth metal pattern 204. The first barrier metal pattern 206 may include titanium, (Ti), tantalum (Ta), or a nitride thereof. As used herein, the term "or" is not an exclusive term, e.g., "A or B" would include A, B, or A and B.

The sixth wiring 208 may have a sixth thickness T6. The sixth thickness T6 may be greater than each of the first to fifth thicknesses. In example embodiments, the sixth thickness T6 may be in range of about 7000 Å to about 12000 Å.

A thickness T6*a* of the sixth via may be greater than 30% of a thickness of the sixth metal pattern T6*b*. Also, the thickness T6*a* of the sixth via may be less than the thickness of the sixth metal pattern T6*b*. In an implementation, the sixth via thickness ratio may be about 30% to about 100%. In example embodiments, the sixth via thickness ratio may be less than each of the first to fifth via thickness ratios. In an implementation, the sixth via thickness ratio may be about 40% to about 70%. However, the thickness of each of the sixth via and the sixth metal pattern may be controlled according to an electrical target of the sixth wiring 208.

An uppermost via 212 may be formed in the second upper insulating interlayer 210. An uppermost metal pattern 214 may be on the second upper insulating interlayer 210, and may contact the uppermost via 212. The uppermost wiring 218 may include the uppermost via 212 and the uppermost metal pattern 214.

The uppermost metal pattern 214 may contact a bump pad. Also, a bump may be on the bump pad. Accordingly, the uppermost metal pattern may be electrically connected to the bump.

The second upper insulating interlayer 210 may include at least silicon oxide. In example embodiments, the second upper insulating interlayer 210 may include one layer, or may include stacked two or more layers including different insulation materials.

In example embodiments, the second upper insulating interlayer 210 may not include silicon nitride. In some example embodiments, the second upper insulating interlayer 210 may include silicon nitride.

In example embodiments, the second upper insulating interlayer 210 may not be used as an oxide layer for supplying hydrogen. In an implementation, the second upper insulating interlayer 210 may not include a high density plasma (HDP) oxide layer.

In example embodiments, the uppermost via 212 may include tungsten. The uppermost metal pattern 214 may include a metal material different from that of the uppermost via 212. In example embodiments, the uppermost metal pattern 214 may include aluminum. In an implementation, the uppermost metal pattern 214 may include an aluminum pattern. In addition, a second barrier metal pattern 216 may be further included on an upper surface of the aluminum pattern. The second barrier metal pattern 216 may include at least one of titanium, (Ti), tantalum (Ta), and a nitride thereof.

The uppermost wiring 218 may have a seventh thickness T7. The seventh thickness T7 may be higher than each of the first to sixth thicknesses. In example embodiments, the seventh thickness T7 may be about 25,000 Å or more. In an implementation, the seventh thickness T7 may be about 25000 Å to about 45000 Å.

In example embodiments, the uppermost metal pattern 214 may have a thickness higher than each of the first to sixth thicknesses. In example embodiments, the uppermost metal pattern 214 may have the thickness of 20000 Å or more. In an implementation, the uppermost metal pattern 214 may have the thickness of about 20000 Å to about 40000 Å.

A thickness T7*a* of the uppermost via may be less than 40% of a thickness T7*b* of the uppermost metal pattern. In an implementation, the thickness T7*a* of the uppermost via may be about 20% to about 35% of the thickness T7*b* of the uppermost metal pattern. In an implementation, the uppermost via thickness ratio may be less than about 40%. In example embodiments, the uppermost via thickness ratio may be less than each of the first to sixth thickness ratios.

The seventh thickness T7 of the uppermost wiring 218 may be greater than thickness of each of other wirings (i.e., each of the first to sixth wirings). Therefore, the uppermost wiring 218 may greatly affect the vertical thermal resistance of the upper wiring structure. However, since the uppermost via thickness ratio is less than about 40%, the thickness of the uppermost via 212 may be less than the thickness of the uppermost metal pattern 214. Accordingly, the seventh thickness T7 of the uppermost wiring 218 may be decreased. The vertical thermal resistance generated by a thick thickness of the uppermost wiring 218 may be decreased.

An oxide layer 220 for supplying hydrogen may be on the second upper insulating interlayer 210 and the uppermost metal pattern 214 to cover the second upper insulating interlayer 210 and the uppermost metal pattern 214. The oxide layer 220 for supplying hydrogen may be silicon oxide containing hydrogen in the layer. The oxide layer for supplying hydrogen may include a high density plasma (HDP) oxide layer.

In processes for manufacturing the semiconductor device, dangling bonds may be generated at an interface between the gate insulation layer of a cell transistor and the substrate 100. In the semiconductor device, leakage currents may increase due to the dangling bonds. In a case of the DRAM device, a refresh operation, which rewrites data stored in the memory cell, may be performed. In order to improve a speed and a durability of the DRAM device, a cycle of the refresh operation (i.e., data retention time) may be increased. However, when the dangling bonds are included at the interface between the gate insulation layer and the substrate 100, leakage currents may be generated in the cell transistor and transistors in peripheral circuits. Thus, the data retention time of the DRAM device may be decreased. Therefore, removing of the dangling bonds at the interface between the gate insulation layer and the substrate 100 may be required.

The oxide layer 220 for supplying hydrogen may be provided to supply hydrogen to the interface between the gate insulation layer and the substrate 100. The oxide layer 220 for supplying hydrogen may be an oxide containing hydrogen. When hydrogen is supplied to the interface between the gate insulation layer and the substrate 100, the dangling bonds may be removed by combining hydrogen with the dangling bonds. Accordingly, in the DRAM device, the leakage currents due to the dangling bonds may be decreased and the data retention time may be increased.

In addition, the oxide layer 220 for supplying hydrogen may be provided to reduce a step difference of an upper surface. In example embodiments, the step difference of the upper surface of the oxide layer 220 for supplying hydrogen may be lower than the step difference of the upper surfaces between the uppermost metal pattern 214 and the second upper insulating interlayer 210.

A thickness of the oxide layer 220 for supplying hydrogen may be greater than 40% of the thickness of the uppermost metal pattern 214, and less than the thickness of the uppermost metal pattern 214. When the thickness of the oxide layer 220 for supplying hydrogen is less than 40% of the thickness of the uppermost metal pattern 214, the step difference of the upper surface of the oxide layer 220 for supplying hydrogen may be high. In addition, when the thickness of the oxide layer 220 for supplying hydrogen is greater than the thickness of the uppermost metal pattern 214, a thickness of an uppermost insulating interlayer 230 formed thereon may be decreased and thus a flatness of the uppermost insulating interlayer 230 may be decreased.

In example embodiments, the thickness of the oxide layer 220 for supplying hydrogen may be greater than the thickness of the uppermost via 212. The oxide layer 220 for supplying hydrogen must have a sufficient thickness required for supplying hydrogen. In an implementation, the thickness of the oxide layer 220 for supplying hydrogen may be about 10000 Å or more.

The uppermost insulating interlayer 230 may be on the oxide layer 220 for supplying hydrogen. An upper surface of the uppermost insulating interlayer 230 may be substantially flat. The uppermost insulating interlayer 230 may include silicon oxide having a high flatness of an upper surface thereof. The uppermost insulating interlayer 230 may include, e.g., TEOS layer.

An upper capping layer 240 may be on the uppermost insulating interlayer 230. The upper capping layer 240 may include, e.g., silicon nitride. The upper capping layer 240 may prevent hydrogen diffused from the oxide layer 220 for supplying hydrogen from moving upward. Accordingly, the hydrogen diffused (or, supplied) from the oxide layer 220 for supplying hydrogen may move in a direction toward the upper surface of the substrate 100.

In the semiconductor device, the vertical thermal resistance may decrease as the thickness of the uppermost wiring decreases. In addition, as hydrogen may be supplied to the substrate 100, the dangling bonds between the substrate 100 and the gate insulation layer may be decreased. Therefore, electrical characteristics of the semiconductor device may be improved.

Figure 3:
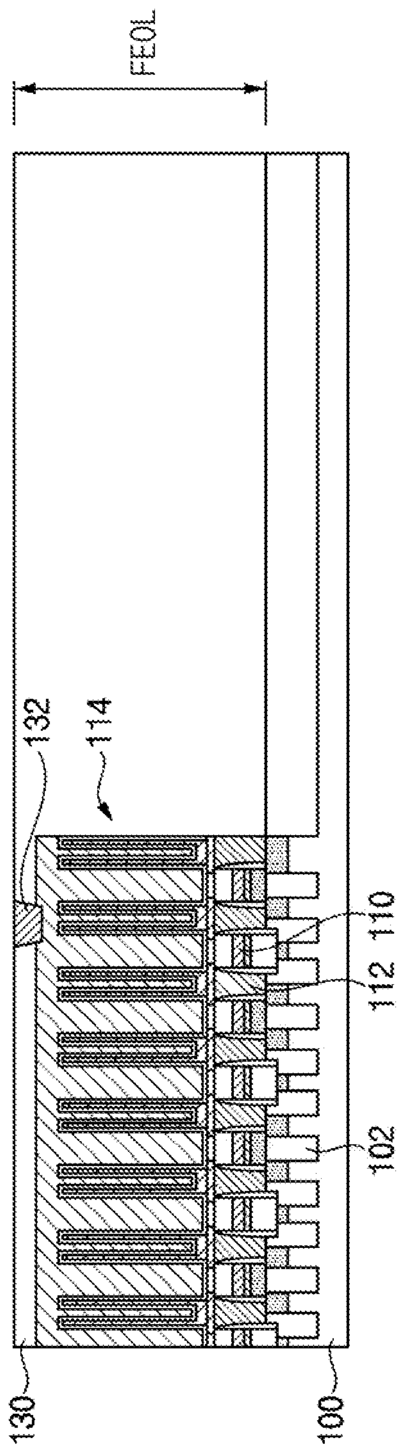
FIGS. 3 to 10 are cross-sectional views illustrating a method of manufacturing a semiconductor device according to example embodiments.

FIGS. 3 to 10 are cross-sectional views illustrating a method of manufacturing a semiconductor device according to example embodiments. Referring to FIG. 3, an isolation process may be performed on the substrate 100 to form an isolation pattern 102. After that, a memory cell structure may be on the substrate 100. The memory cell structure may include cell transistors, bit line structures 110, first lower wirings 112 and capacitors 114.

A lower insulating interlayer 130 may be on the substrate 100 to cover the memory cell structure. A contact plug 132 may be further formed in the lower insulating interlayer 130, and the contact plug 132 may be electrically connected to the capacitor 114. The memory cell structure and the lower insulating interlayer 130 may serve as a FEOL structure.

Figure 4:
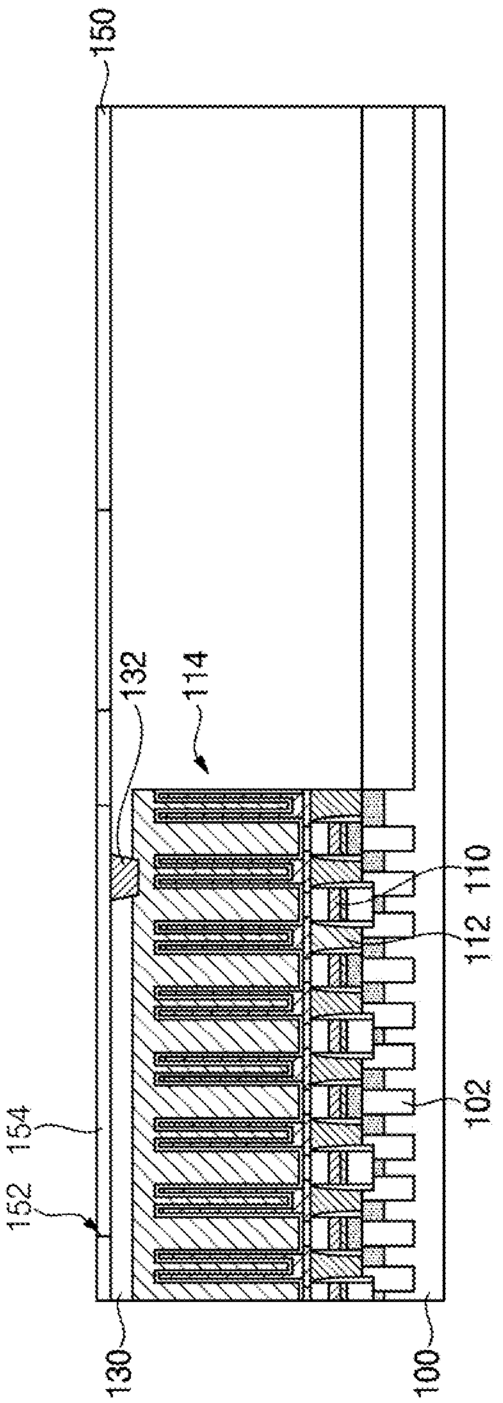

Referring to FIG. 4, a first low-k dielectric layer 150 may be on the lower insulating interlayer 130. A portion of the first low-k dielectric layer 150 may be etched to form a first opening 152. A first metal layer may be formed in the first opening 152, and an upper surface of the first metal layer may be planarized to form a first metal pattern. The first metal pattern may serve as the first wiring 154. As such, the first wiring 154 may be formed by a single damascene process.

In example embodiments, the first wiring 154 may include, e.g., copper. The first wiring 154 may include a metal pattern including copper and a barrier pattern surrounding sidewalls and bottom surfaces of the metal pattern. In an implementation, the barrier pattern may include at least one of titanium, (Ti), tantalum (Ta), and a nitride thereof.

In example embodiments, a first thickness of the first wiring 154 may be in a range of about 1000 Å to about 3000 Å.

Figure 5:
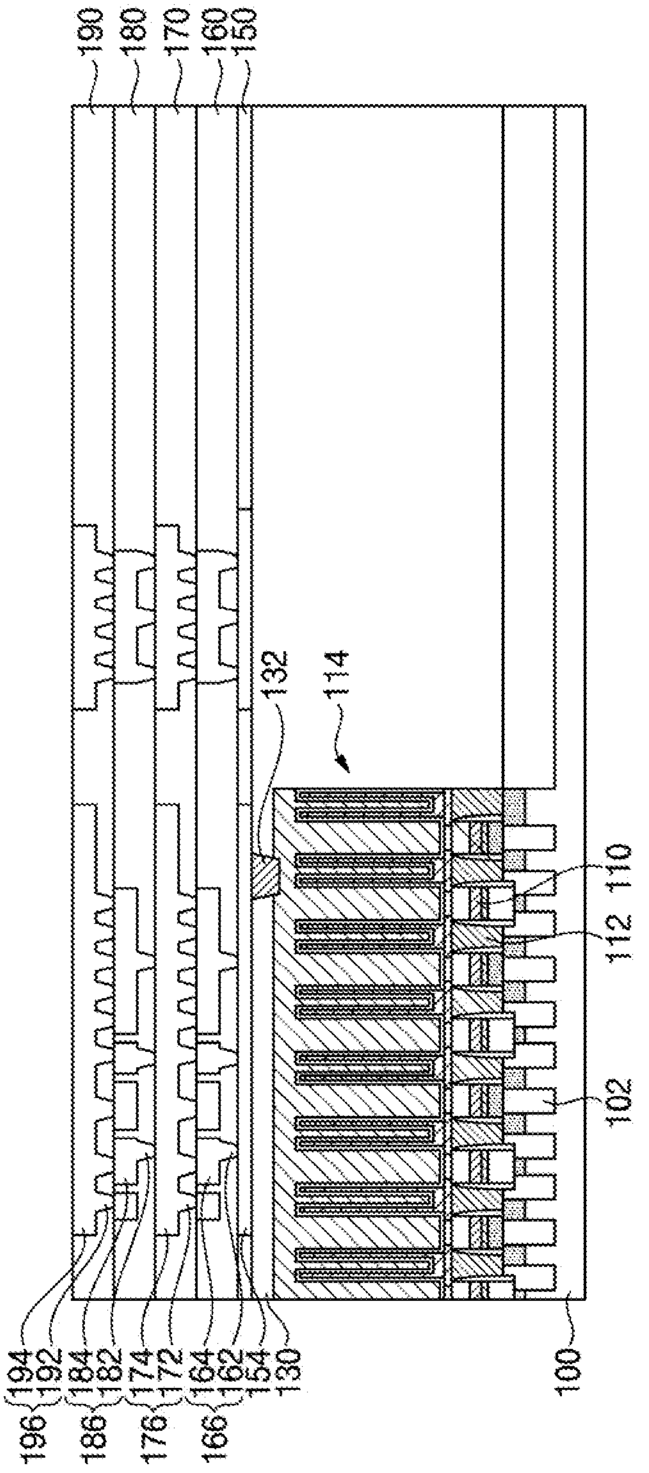

Referring to FIG. 5, a second low-k dielectric layer 160 may be on the first low-k dielectric layer 150 and the first wiring 154. A portion of the second low-k dielectric layer 160 may be etched to form a second via hole. In addition, a second opening communicating with the second via hole may be on the second via hole.

A second metal layer may be formed in the second via hole and the second opening, and an upper surface of the second metal layer may be planarized to form the second via 162 and the second metal pattern 164. The second via 162 and the second metal pattern 164 may serve as a second wiring 166. As such, the second wiring 166 may be formed by a dual damascene process. In example embodiments, the second wiring 166 may include, e.g., copper.

By repeatedly performing the dual damascene process, the third low-k dielectric layer 170, the third wiring 176, the fourth low-k dielectric layer 180, the fourth wiring 186, the fifth low-k dielectric layer 190 and the fifth wiring 196 may be sequentially on the second low-k dielectric layer 160 and the second wiring 166.

The second to fifth wires 166, 176, 186, and 196 may have second to fifth thicknesses, respectively. The second to fifth thicknesses may be the same as or different from each other. In example embodiments, the second to fifth thicknesses may be in range of about 4000 Å to about 8000 Å.

In the n-th wiring (n is e.g., 2 to 5), the thickness of the n-th via may be greater than 50% of the thickness of the n-th metal pattern. Also, the thickness of the n-th via may be less than the thickness of the n-th metal pattern. In an implementation, an n-th via thickness ratio may be about 50% to about 100%.

Figure 6:
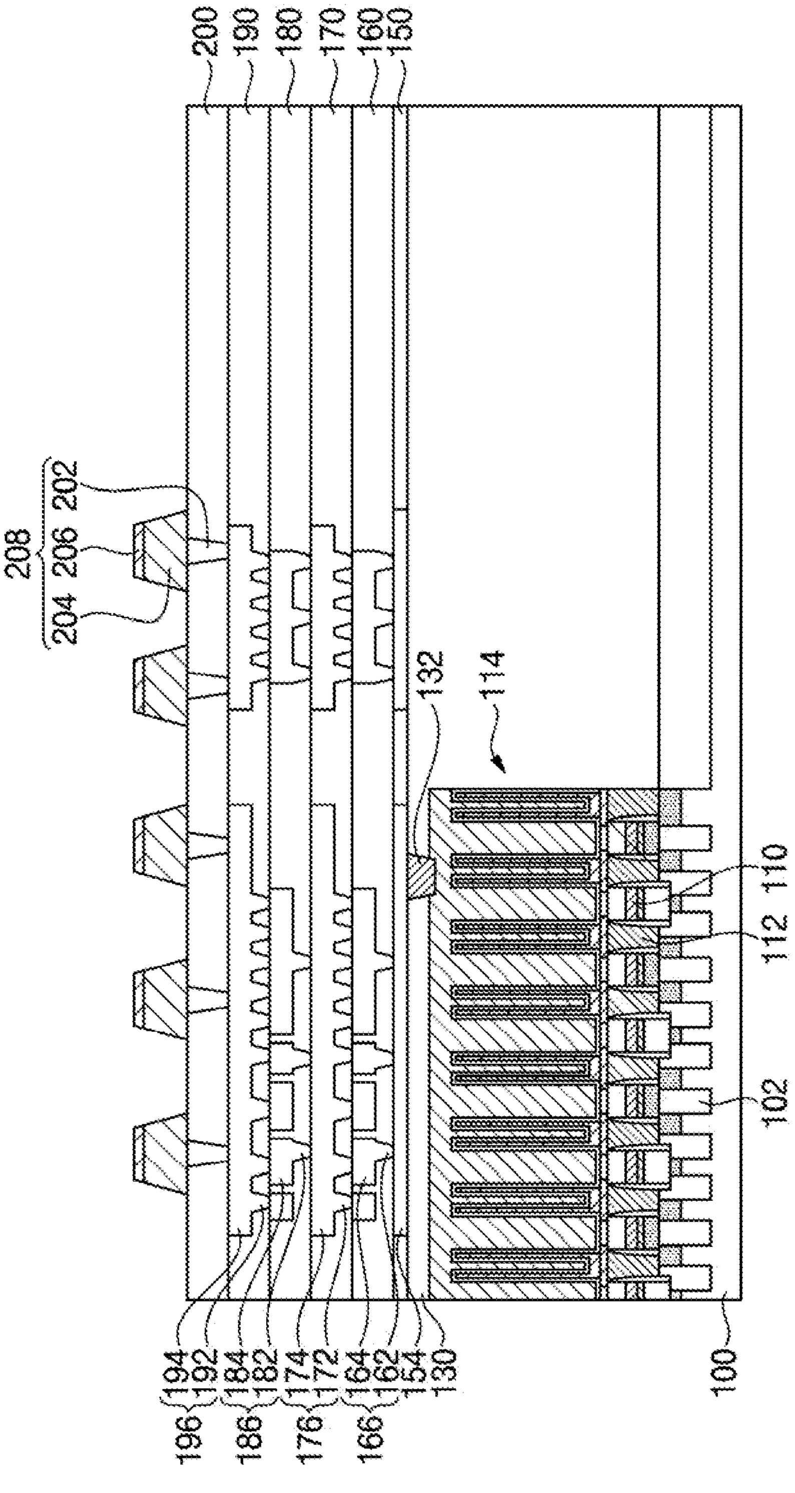

Referring to FIG. 6, a first upper insulating interlayer 200 may be on the fifth low-k dielectric layer 190 and the fifth wiring 196. A portion of the first upper insulating interlayer 200 may be etched to form a sixth via hole. A metal layer may be formed to fill the sixth via hole, and an upper surface of the metal layer may be planarized to form a sixth via 202 in the sixth via hole. The sixth via 202 may include, e.g., tungsten.

The first upper insulating interlayer 200 may be a silicon oxide-based insulation layer. In example embodiments, the first upper insulating interlayer 200 may not be used as an oxide layer for supplying hydrogen. Therefore, the high-density plasma oxide layer may not be included in the first upper insulating interlayer 200.

A sixth metal layer and a first barrier metal layer may be on the first upper insulating interlayer 200 and the sixth via 202. The sixth metal layer may include, e.g., aluminum, tungsten or copper. The first barrier metal layer may include at least one of titanium, (Ti), tantalum (Ta), and a nitride thereof.

The first barrier metal layer and the sixth metal layer may be patterned to form a sixth metal pattern 204 and a first barrier metal pattern 206. Accordingly, a sixth wiring 208 including the sixth via 202 and the sixth metal pattern 204 may be formed. In an implementation, the sixth wiring 208 may further include the first barrier metal pattern 206 on the sixth metal pattern 204.

The sixth wiring 208 may have a sixth thickness. The sixth thickness may be greater than each of the first to fifth thicknesses. In example embodiments, the sixth thickness may be in range of about 7000 Å to about 12000 Å.

A thickness of the sixth via 202 may be greater than 30% of a thickness of the sixth metal pattern 204. Also, the thickness of the sixth via 202 may be less than the thickness of the sixth metal pattern 204. In an implementation, a sixth via thickness ratio may be 30% to 100%. In example embodiments, the sixth via thickness ratio may be less than each of the first to fifth via thickness ratios.

Figure 7:
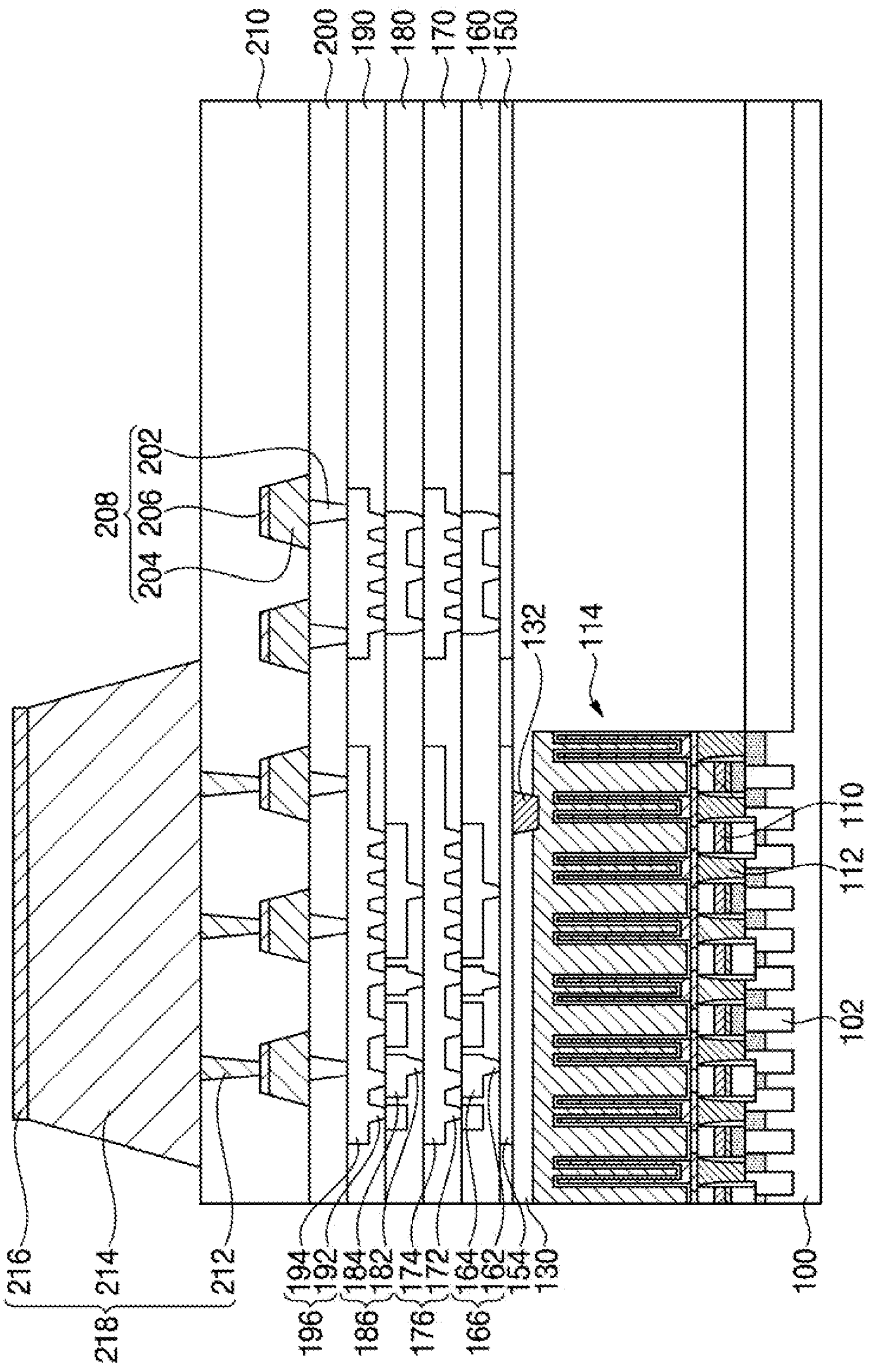

Referring to FIG. 7, a second upper insulating interlayer 210 may be on the first upper insulating interlayer 200 and the sixth metal pattern 204. A portion of the second upper insulating interlayer 210 may be etched to form an uppermost via hole. A metal layer may be formed to fill the uppermost via hole, and the metal layer may be planarized to form an uppermost via 212 in the uppermost via hole. The uppermost via 212 may include, e.g., tungsten. The second upper insulating interlayer 210 may include at least a silicon oxide-based insulation layer.

The second upper insulating interlayer 210 may include one layer, or may include stacked two or more layers including different insulation materials.

In example embodiments, the second upper insulating interlayer 210 may not include silicon nitride. In some example embodiments, the second upper insulating interlayer 210 may include silicon nitride.

In example embodiments, the second upper insulating interlayer 210 may not be used as an oxide layer for supplying hydrogen. In an implementation, the second upper insulating interlayer 210 may not include a high density plasma (HDP) oxide layer.

A seventh metal layer and a second barrier metal layer may be on the second upper insulating interlayer 210 and the uppermost via 212. The seventh metal layer may include, e.g., aluminum. The second barrier metal layer may include at least one of titanium, (Ti), tantalum (Ta), and a nitride thereof.

The second barrier metal layer and the seventh metal layer may be patterned to form an uppermost metal pattern 214 and a second barrier metal pattern 216. Accordingly, an uppermost wiring 218 including the uppermost via 212 and the uppermost metal pattern 214 may be formed. In an implementation, the uppermost wiring 218 may further include the second barrier metal pattern 216 on the uppermost metal pattern 214.

As such, the uppermost via 212 and the uppermost metal pattern 214 included in the uppermost wiring 218 may include different metal materials to each other.

The uppermost wiring 218 may have a seventh thickness. The seventh thickness may be greater than each of the first to sixth thicknesses. In example embodiments, the seventh thickness may be 25,000 Å or more. In an implementation, the seventh thickness may be about 25000 Å to about 45000 Å.

In example embodiments, a thickness of the uppermost metal pattern 214 may be greater than each of the first to sixth thicknesses. In example embodiments, the thickness of the uppermost metal pattern 214 may be 20000 Å or more. In an implementation, the thickness of the uppermost metal pattern 214 may be about 20000 Å to about 40000 Å.

A thickness of the uppermost via 212 may be less than 40% of the thickness of the uppermost metal pattern 214. In an implementation, the thickness of the uppermost via 212 may be 20% to 35% of the thickness of the uppermost metal pattern 214.

An uppermost via thickness ratio may be less than 40%. In example embodiments, the uppermost via thickness ratio may be less than each of the first to sixth thickness ratios.

As such, since the uppermost via thickness ratio is less than 40%, the thickness of the uppermost wiring 218 may be decreased. Therefore, vertical thermal resistance due to the thickness of the uppermost wiring 218 may be decreased.

Figure 8:
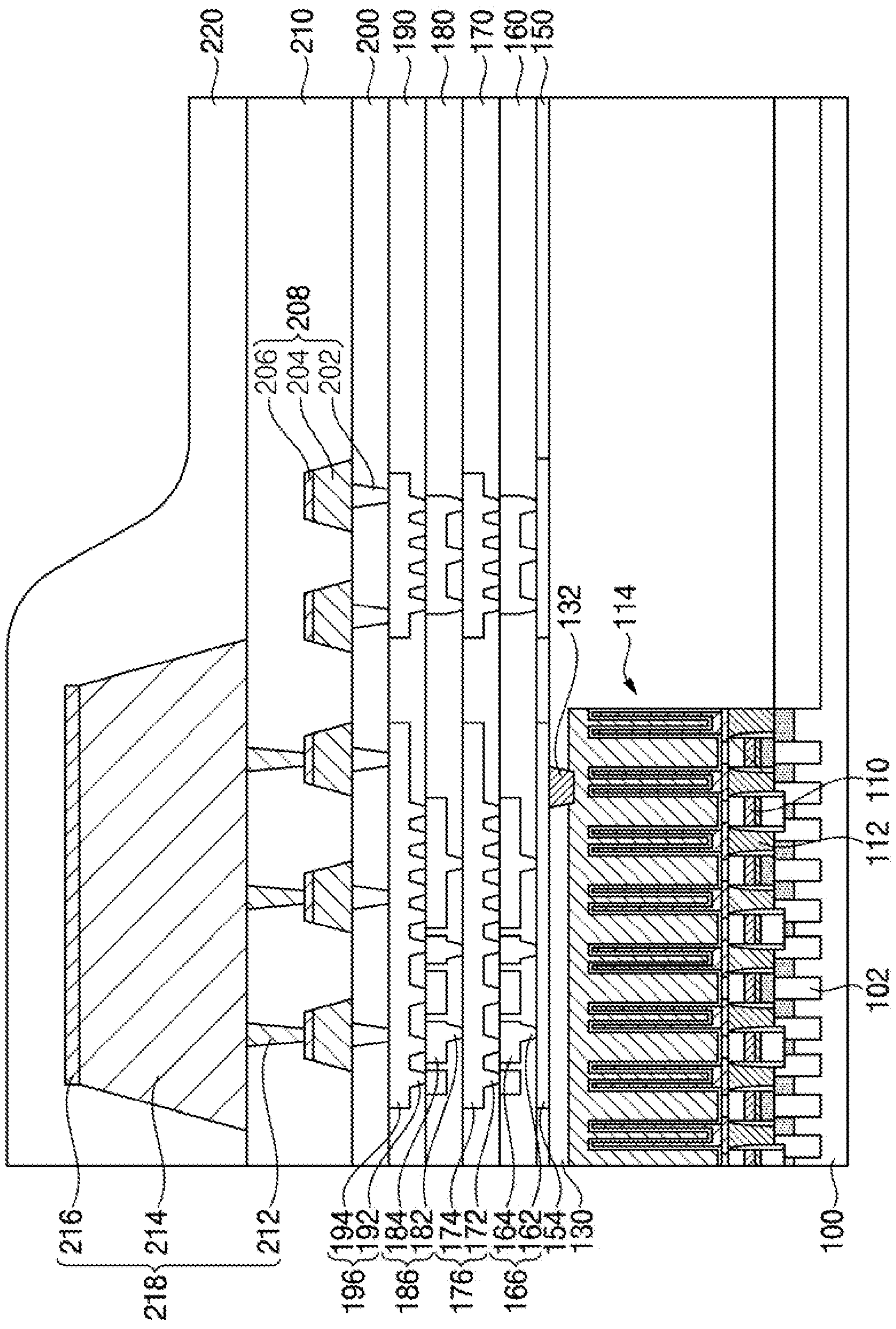

Referring to FIG. 8, an oxide layer 220 for supplying hydrogen may be on the second upper insulating interlayer 210 and the uppermost wiring 218 to cover the second upper insulating interlayer 210 and the uppermost wiring 218. The oxide layer 220 for supplying hydrogen may include a high density plasma (HDP) oxide layer.

A thickness of the oxide layer 220 for supplying hydrogen may be greater than 40% of the thickness of the uppermost metal pattern 214, and may be less than the thickness of the uppermost metal pattern 214. In addition, the thickness of the oxide layer 220 for supplying hydrogen may be greater than the thickness of the uppermost via 212. In an implementation, the thickness of the oxide layer 220 for supplying hydrogen may be 10000 Å or more.

Figure 9:
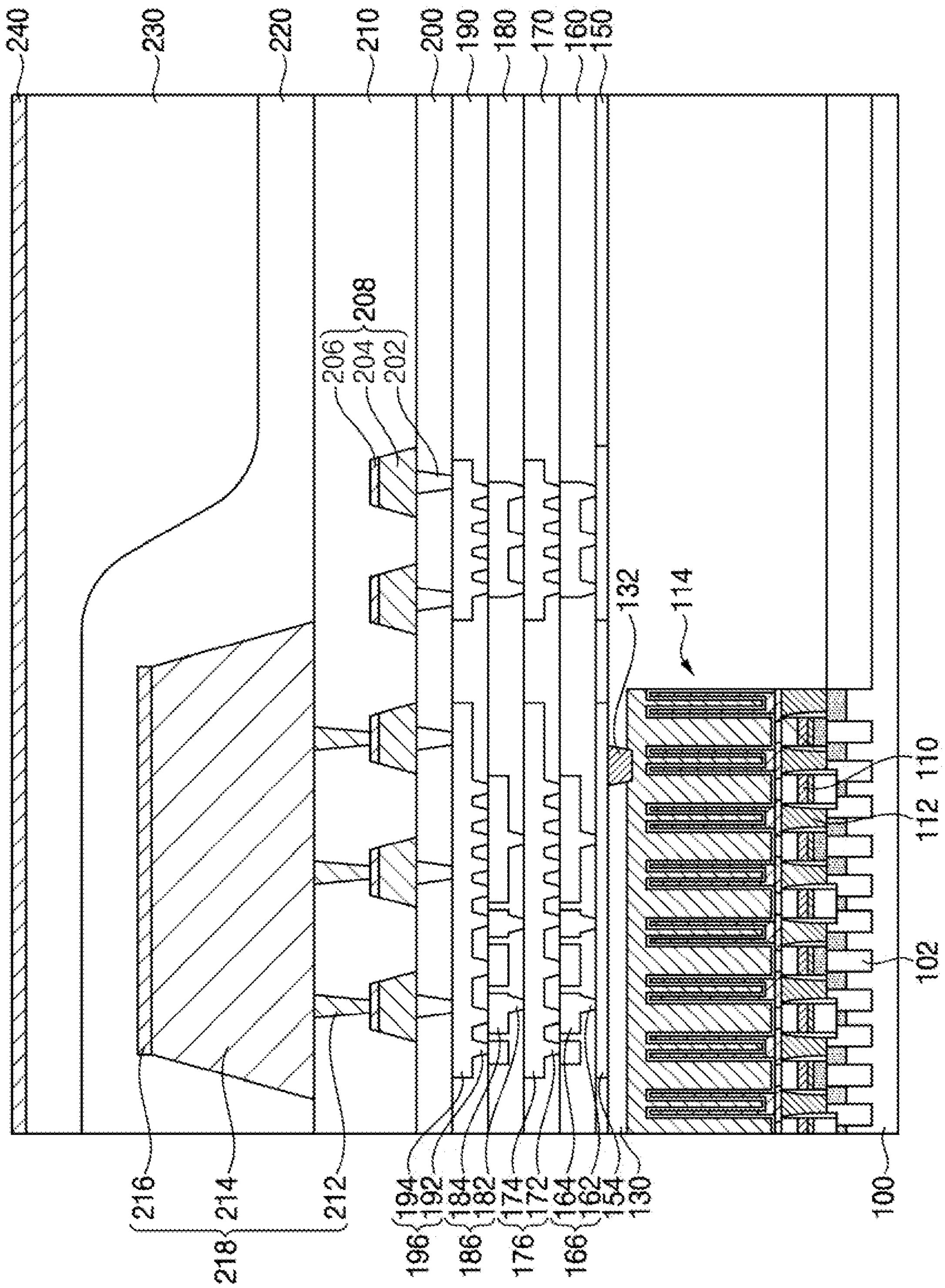

Referring to FIG. 9, an uppermost insulating interlayer 230 may be on the oxide layer 220 for supplying hydrogen. The uppermost insulating interlayer 230 may include an oxide having a high flatness of an upper surface thereof. The uppermost insulating interlayer 230 may include a TEOS layer.

An upper capping layer 240 may be on the uppermost insulating interlayer 230. The upper capping layer 240 may include, e.g., silicon nitride.

Figure 10:
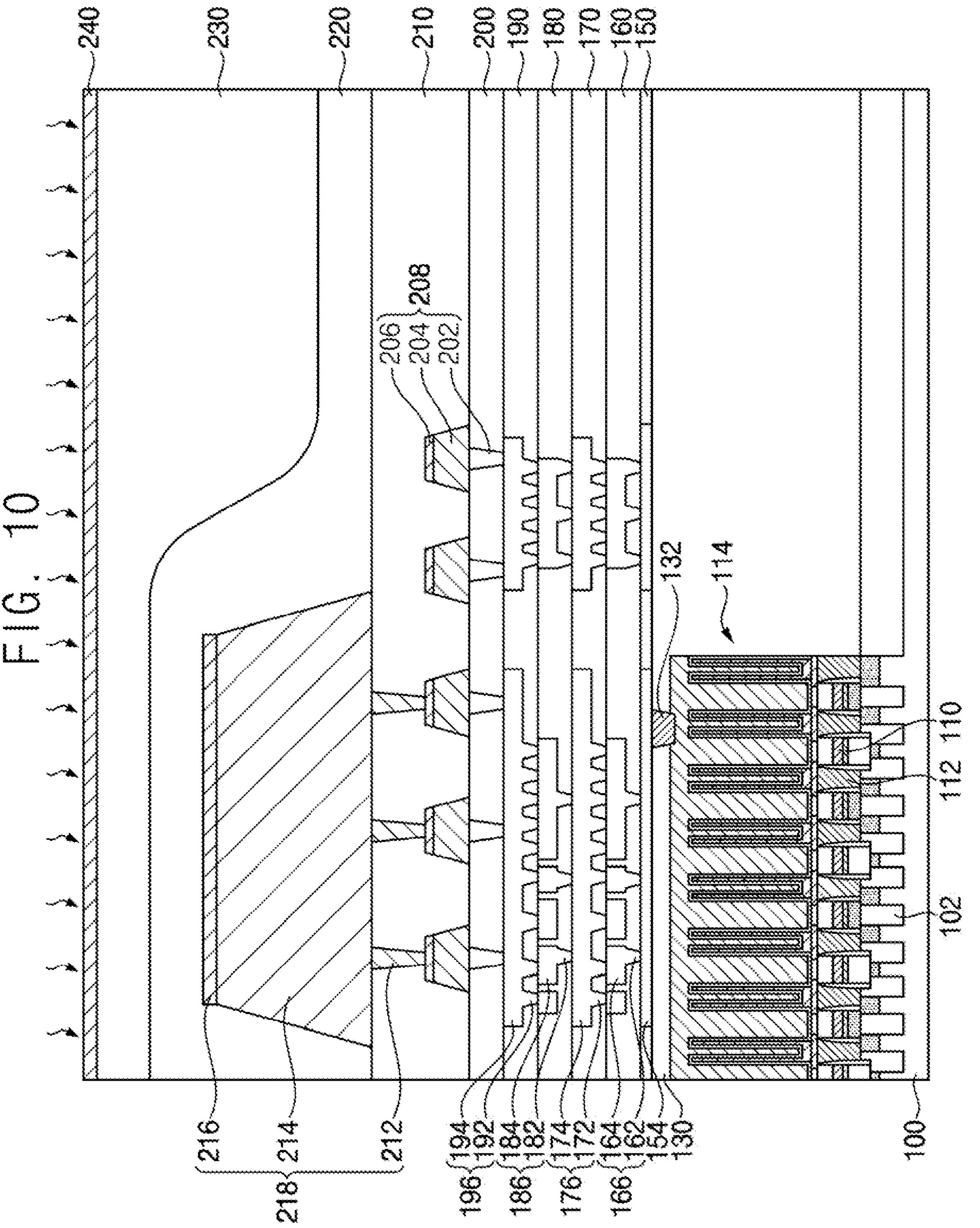

Referring to FIG. 10, an alloy process may be performed to diffuse hydrogen in the oxide layer 220 for supplying hydrogen to the upper surface of the substrate 100.

The alloying process may include heat treatment performed at a temperature of about 300° C. to about 500° C., for tens to hundreds of minutes. In the heat treatment process, heat may be applied to the upper capping layer 240, and thus the hydrogen included the oxide layer 220 for supplying hydrogen may be transferred to the surface of the substrate 100 through multi-layer wirings and lower wirings formed thereunder. Thus, dangling bonds at interface between the substrate 100 and the gate insulating layer of the transistor may be removed by the hydrogen.

In the embodiment, the thickness of the uppermost via 212 may be less than 40% of the thickness of the uppermost metal pattern 214. Accordingly, the thickness of the uppermost wiring 218 may be decreased, and the vertical thermal resistance of the semiconductor device may be decreased.

The above-described semiconductor device may be used in a memory die included in a high bandwidth memory (HBM). Hereinafter, a high-bandwidth memory including the semiconductor device may be described.

Figure 11:
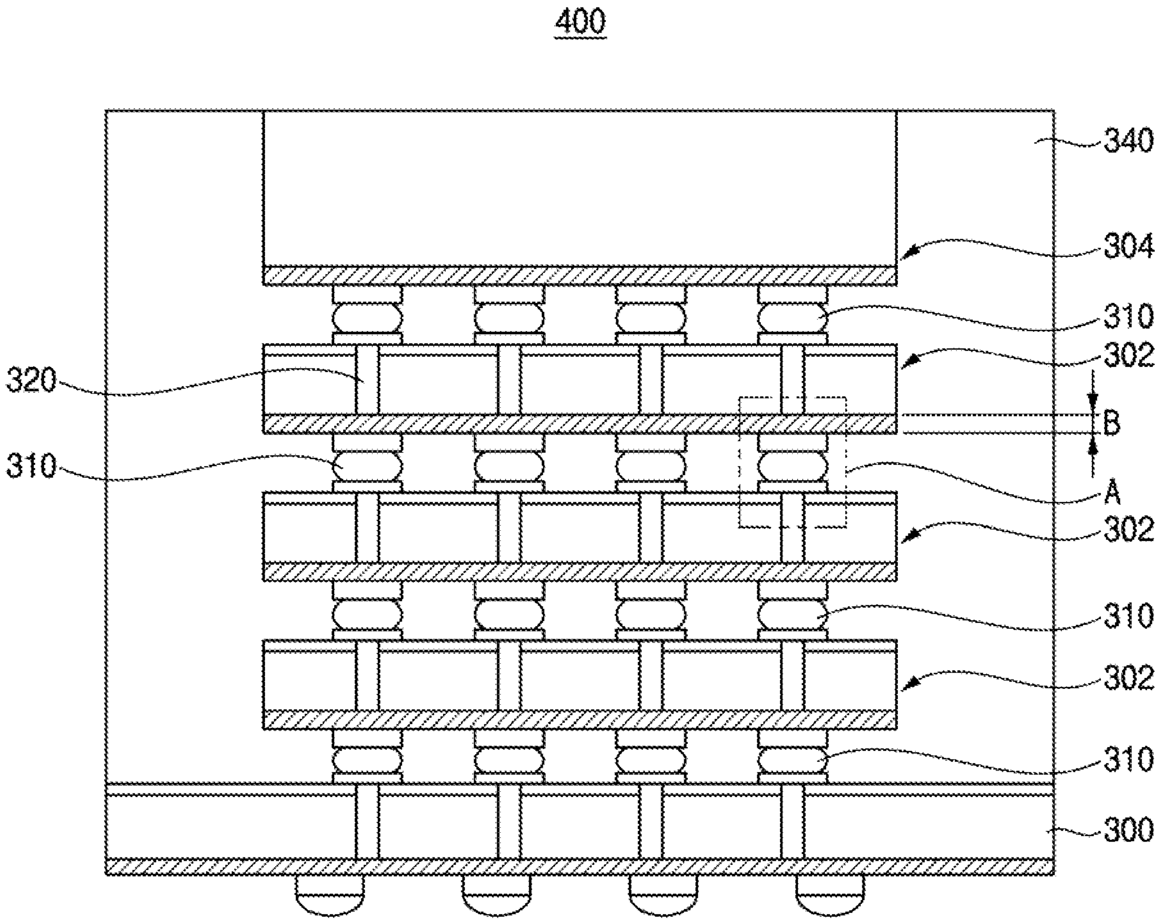
FIG. 11 is a cross-sectional view of a semiconductor device according to example embodiments.
Figure 12:
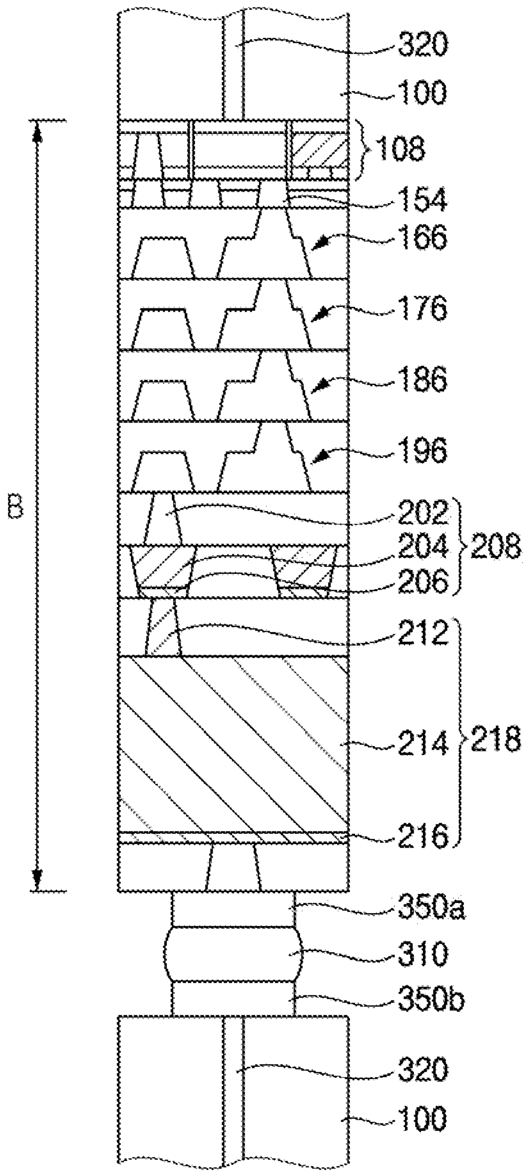
FIG. 12 is an enlarged view of a disclosed embodiment of portion A of FIG. 11.

FIG. 11 is a cross-sectional view of a semiconductor device according to according to example embodiments. FIG. 12 is an enlarged view of a portion A of FIG. 11. A portion B in FIG. 12 may correspond to a portion B in FIG. 11.

Referring to FIGS. 11 and 12, the high-bandwidth memory may include a package substrate 300, a plurality of memory dies (i.e., chips 302) and a logic die 304 stacked on the package substrate 300, and a molding member 340. The high-bandwidth memory may further include conductive bumps 310 and external connection terminals.

The package substrate 300 may be a printed circuit board (PCB) including a circuit pattern therein. Board pads may be on an upper surface of the package substrate 300, and the external connection terminals such as solder balls may be on a lower surface of the package substrate 300.

The logic die 304 may be electrically connected to the memory dies 302, and may control operations (e.g., input/output of signals) of the memory dies 302. In example embodiments, the logic die 304 may be positioned on a lowermost layer or an uppermost layer of the package substrate 300. The logic die 304 may be positioned under a lowermost memory die or on an uppermost memory die. In an implementation, as shown in FIG. 11, the logic die 304 may be on the uppermost memory die.

Each of the memory dies 302 may include the semiconductor device according to example embodiments described above. In portions B of FIGS. 11 and 12, in the memory die 302, a memory cell structure 108 may be on the substrate 100, and the first to sixth wirings 154, 166, 176, 186, 196 and 208 and an uppermost wiring 218 may be on the memory cell structure 108. The memory die 302 may be disposed so that an upper surface of the substrate 100 on which the memory cell structure 108 is formed may face downward.

The memory die 302 may include a through-silicon via 320 penetrating the substrate 100. A first bump pad 350*a* may be connected to the uppermost metal pattern 214. A second bump pad 350*b* may be connected to the through-silicon via 320.

In upper and lower memory dies 302 adjacent to each other in a vertical direction, the conductive bump 310 may be interposed between the second bump pad 350*b* contacting the lower memory die and the first bump pad 350*a* contacting the upper memory die.

In FIGS. 11 and 12 of the high-bandwidth memory device, the memory dies 302 may be stacked in three layers. However, it is not limited thereto. In an implementation, the memory dies 302 may be stacked in 10 or more layers. The number of memory dies stacked in the high-bandwidth memory may be continuously increased, and thus the vertical thermal resistance generated in each of memory dies in the high-bandwidth memory may be increased.

As described above, each of memory dies may include the semiconductor device according to example embodiments. In an implementation, in each of memory dies, the thickness of the uppermost via 212 may be less than 40% of the thickness of the uppermost metal pattern 214. Accordingly, the thickness of the uppermost wiring 218 may be decreased, and thus the vertical thermal resistance may be decreased in each of the memory dies. Therefore, the high-bandwidth memory may have low vertical thermal resistance.

By way of summation and review, example embodiments provide a semiconductor device including an upper wiring structure having low thermal resistance.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages. Accordingly, all such modifications are intended to be included within the scope as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarify of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:

lower metal wirings on a substrate, the lower metal wirings stacked in a plurality of layers;

a first upper insulating interlayer on the lower metal wirings;

a first upper wiring including a first upper via in the first upper insulating interlayer and a first upper metal pattern on the first upper insulating interlayer;

a second upper insulating interlayer on the first upper insulating interlayer, the second upper insulating interlayer covering the first upper metal pattern;

an uppermost wiring including an uppermost via in the second upper insulating interlayer and an uppermost metal pattern on the second upper insulating interlayer; and an oxide layer for supplying hydrogen on the second upper insulating interlayer, the oxide layer for supplying hydrogen covering the uppermost wiring, wherein a thickness of the uppermost via is less than 40% of a thickness of the uppermost metal pattern, and wherein a thickness of a portion of the oxide layer located on a top surface of the uppermost metal pattern is greater than 40% of the thickness of the uppermost metal pattern and is less than the thickness of the uppermost metal pattern, and wherein an upper surface of the oxide layer includes a step difference that is lower than a step difference between the top surface of the uppermost metal pattern and a top surface of the second upper insulating interlayer.

2. The semiconductor device as claimed in claim 1, wherein the thickness of the uppermost metal pattern is 20000 Å to 40000 Å.

3. The semiconductor device as claimed in claim 1, wherein the thickness of the uppermost via is 20% to 35% of the thickness of the uppermost metal pattern.

4. The semiconductor device as claimed in claim 1, wherein a metal included in the first upper wiring and a metal included in the uppermost wiring are different from a metal included in the lower metal wirings.

5. The semiconductor device as claimed in claim 4, wherein the metal included in each of the lower metal wirings is copper.

6. The semiconductor device as claimed in claim 1, wherein the uppermost via includes tungsten, and the uppermost metal pattern includes aluminum.

7. The semiconductor device as claimed in claim 1, wherein each of the lower metal wirings includes a via and a metal pattern, and a thickness of the via is 50% to 100% of a thickness of the metal pattern.

8. The semiconductor device as claimed in claim 1, wherein an uppermost via thickness ratio, which is the thickness of the uppermost via divided by the thickness of the uppermost metal pattern multiplied by 100, is less than a first upper via thickness ratio, which is the thickness of the first upper via divided by the thickness of the first upper metal pattern multiplied by 100.

9. The semiconductor device as claimed in claim 1, wherein a thickness of the first upper via in the first upper wiring is 30% to 100% of a thickness of the first upper metal pattern.

10. The semiconductor device as claimed in claim 1, wherein the oxide layer for supplying hydrogen includes a high density plasma oxide layer.

11. The semiconductor device as claimed in claim 1, further comprising:

an uppermost insulating interlayer on the oxide layer for supplying hydrogen, the uppermost insulating interlayer including silicon oxide and disposed to fill the step difference on the upper surface of the oxide layer such that the uppermost insulating interlayer has a flat upper surface; and an upper capping layer on the uppermost insulating interlayer.

12. The semiconductor device as claimed in claim 1, further comprising memory cells between the substrate and the lower metal wirings in a vertical direction.

13. The semiconductor device as claimed in claim 1, further comprising bump pads electrically connected to the uppermost metal pattern and bumps on the bump pad.

14. A semiconductor device, comprising:

memory cells on a substrate;

lower metal wirings on the memory cells, the lower metal wirings stacked in a plurality of layers;

a first upper insulating interlayer on the lower metal wirings;

a first upper wiring including a first upper via in the first upper insulating interlayer and a first upper metal pattern on the first upper insulating interlayer;

a second upper insulating interlayer on the first upper insulating interlayer;

an uppermost wiring including an uppermost via in the second upper insulating interlayer and an uppermost metal pattern on the second upper insulating interlayer;

an oxide layer for supplying hydrogen on the second upper insulating interlayer, the oxide layer for supplying hydrogen covering the uppermost wiring;

an uppermost insulating interlayer on the oxide layer for supplying hydrogen, the uppermost insulating interlayer including silicon oxide and having a flat upper surface; and an upper capping layer on the uppermost insulating interlayer; and a stack structure including the oxide layer for supplying hydrogen and the uppermost insulating interlayer, the stack structure covering an upper surface of the uppermost metal pattern of the uppermost wiring, wherein:

a thickness of the uppermost via is less than 40% of a thickness of the uppermost metal pattern, a thickness of a portion of the oxide layer located on the upper surface of the uppermost metal pattern is greater than 40% of the thickness of the uppermost metal pattern and is less than the thickness of the uppermost metal pattern, an upper surface of the oxide layer includes a step difference that is lower than a step difference between the top surface of the uppermost metal pattern and a top surface of the second upper insulating interlayer, and the uppermost insulating interlayer is disposed to fill the step difference on the upper surface of the oxide layer such that the uppermost insulating interlayer has the flat upper surface.

15. The semiconductor device as claimed in claim 14, wherein an uppermost via thickness ratio, which is the thickness of the uppermost via divided by the thickness of the uppermost metal pattern multiplied by 100, is less than a first upper via thickness ratio, which is the thickness of the first upper via divided by the thickness of the first upper metal pattern multiplied by 100.

16. The semiconductor device as claimed in claim 14, wherein the thickness of the oxide layer located on the upper surface of the uppermost metal pattern is greater than the thickness of the uppermost via.

17. The semiconductor device as claimed in claim 14, wherein a thickness of the uppermost metal pattern is greater than each of a thickness of the first upper wiring and a thickness of each lower metal pattern in the lower metal wirings.

18. A high-bandwidth memory device, comprising:

a package substrate;

a plurality of memory dies stacked on the package substrate;

a logic die on the plurality of memory dies; and a molding member on the package substrate, the molding member covering the memory dies and the logic die, wherein each of the plurality of memory dies includes:

lower metal wirings on a substrate, the lower metal wirings stacked in a plurality of layers;

a first upper wiring on the lower metal wirings, the first upper wiring including a first upper via and a first upper metal pattern;

an uppermost wiring on the first upper wiring, the uppermost wiring including an uppermost via and an uppermost metal pattern; and an oxide layer for supplying hydrogen that covers a top surface of the uppermost metal pattern, wherein a thickness of the uppermost via is less than 40% of a thickness of the uppermost metal pattern, and wherein a thickness of a first portion of the oxide layer located on a top surface of the uppermost metal pattern and a second portion of the oxide layer located adjacent to the uppermost metal pattern and below a level of the top surface of the uppermost metal pattern are each is greater than 40% of the thickness of the uppermost metal pattern and less than the thickness of the uppermost metal pattern.

19. The high-bandwidth memory device as claimed in claim 18, wherein each of the memory dies includes:

a through-silicon via penetrating the substrate;

a first bump pad connected to the uppermost metal pattern; and a second bump pad connected to the through-silicon via.

20. The high-bandwidth memory device of claim 18, wherein: the thickness of each of the first and second portions of the oxide layer for supplying hydrogen is 10000 angstroms or more.

* * * * *